(12) United States Patent
Yoshikawa et al.

(10) Patent No.: US 10,982,093 B2
(45) Date of Patent: Apr. 20, 2021

(54) LOW-DIELECTRIC RESIN COMPOSITION

(71) Applicant: ARISAWA MFG. CO., LTD., Niigata (JP)

(72) Inventors: Kazuo Yoshikawa, Niigata (JP); Makoto Tai, Niigata (JP); Nobuyuki Iwano, Niigata (JP)

(73) Assignee: Arisawa Mfg. Co., Ltd., Niigata (JP)

( * ) Notice: Subject to any disclaimer, the term of this patent is extended or adjusted under 35 U.S.C. 154(b) by 73 days.

(21) Appl. No.: 15/549,657

(22) PCT Filed: Feb. 8, 2016

(86) PCT No.: PCT/JP2016/053710
§ 371 (c)(1),
(2) Date: Aug. 8, 2017

(87) PCT Pub. No.: WO2016/129565
PCT Pub. Date: Aug. 18, 2016

(65) Prior Publication Data
US 2018/0022919 A1 Jan. 25, 2018

(30) Foreign Application Priority Data

Feb. 9, 2015 (JP) .............................. JP2015-023588

(51) Int. Cl.
| C08L 75/04 | (2006.01) |
| B32B 27/20 | (2006.01) |
| B32B 15/20 | (2006.01) |
| B32B 15/08 | (2006.01) |
| H05K 1/03 | (2006.01) |
| B32B 7/06 | (2019.01) |
| B32B 7/12 | (2006.01) |
| B32B 27/08 | (2006.01) |

(52) U.S. Cl.
CPC ................ *C08L 75/04* (2013.01); *B32B 7/06* (2013.01); *B32B 7/12* (2013.01); *B32B 15/08* (2013.01); *B32B 15/20* (2013.01); *B32B 27/08* (2013.01); *B32B 27/20* (2013.01); *H05K 1/0373* (2013.01); *B32B 2307/204* (2013.01); *B32B 2457/08* (2013.01); *H05K 2201/0137* (2013.01); *H05K 2201/05* (2013.01)

(58) Field of Classification Search
CPC .......... B32B 7/06; B32B 27/38; B32B 27/40; B32B 15/20; B32B 15/08; B32B 7/12; B32B 27/08; B32B 27/20; B32B 2307/204; B32B 2457/08; B32B 2307/748; B32B 2307/206; B32B 27/365; B32B 27/285; B32B 27/288; B32B 27/322; B32B 27/304; B32B 2250/02; B32B 2250/24; B32B 15/082; B32B 15/09; B32B 27/10; B32B 27/286; B32B 27/302; H05K 1/0373; H05K 2201/0137; H05K 2201/05; H05K 2201/0212; H05K 1/0346; C08G 18/44; C08G 18/73; C08G 18/6659; C08G 59/4269; C08G 18/348; H01L 33/302; C09J 163/00; C08L 25/06; C08L 75/04; C08L 25/04; H01B 3/302; H01B 3/40

See application file for complete search history.

(56) References Cited

U.S. PATENT DOCUMENTS

| 2009/0008138 A1* | 1/2009 | Uchida ................ C08G 18/758 174/256 |
| 2009/0099283 A1* | 4/2009 | Ishihara ................ C08G 18/12 524/107 |
| 2009/0156752 A1* | 6/2009 | Uchida .............. C08G 18/0823 525/403 |
| 2010/0201802 A1* | 8/2010 | Onishi ............... C08G 18/0823 348/87 |
| 2012/0250268 A1* | 10/2012 | Ito ........................ C08G 18/348 361/748 |

FOREIGN PATENT DOCUMENTS

| JP | 2008-75012 A | 4/2008 |
| JP | 2010-031182 A | 2/2010 |
| JP | 2010-285624 A | 12/2010 |
| JP | 2011-94037 A | 5/2011 |
| WO | WO 2007/105713 A1 | 9/2007 |
| WO | WO 2008/146908 A1 | 12/2008 |
| WO | WO 2010/073981 A1 | 7/2010 |
| WO | WO 2011/040560 A1 | 4/2011 |
| WO | WO 2013/111478 A1 | 8/2013 |

OTHER PUBLICATIONS

International Search Report and Written Opinion dated May 10, 2016 in connection with PCT/JP2016/053710.

* cited by examiner

Primary Examiner — John D Freeman
(74) Attorney, Agent, or Firm — Wolf, Greenfield & Sacks, P.C.

(57) ABSTRACT

The present invention provides a low-dielectric resin composition comprising (A) a urethane resin obtained by reacting a polycarbonate diol and an isocyanate, (B) an epoxy resin, and (C) a filler, wherein the (A) urethane resin has a carboxyl group equivalent weight of 1,100 to 5,700 g/eq; the epoxy equivalent weight of the (B) epoxy resin is 0.3 to 4.5 equivalents per 1.0 equivalent of the carboxyl group of the (A) urethane resin, the (A) urethane resin has a weight-average molecular weight of 5,000 to 80,000; the (A) urethane resin has a polycarbonate content of 35% by mass or lower; the resin composition comprises 50 parts by mass or less of the (C) filler per 100 parts by mass of the (A) urethane resin; and the resin composition comprises substantially no imido group.

17 Claims, No Drawings

… (1)

LOW-DIELECTRIC RESIN COMPOSITION

The present application is a National Phase entry of International Application No. PCT/JP2016/053710, filed Feb. 8, 2016, which claims priority of Japanese Application No. 2015-023588, filed Feb. 9, 2015.

TECHNICAL FIELD

The present invention relates to a low-dielectric resin composition.

BACKGROUND ART

In recent years, the higher frequency application in signal is developing along with the speedup of transmission signals in flexible printed circuit boards (hereinafter, referred to as "FPC" in some cases).

Further, it has been demanded so far that FPC be excellent in properties such as close adhesion, heat resistance and circuit embeddability.

Therefore, there have been raised the demands for materials for FPC towards, in addition to the excellence in close adhesion, heat resistance, circuit embeddability and the like, the excellence in low-dielectric properties in the high-frequency region, such as low dielectric constant and low dielectric loss tangent.

Patent Literature 1 discloses a cyanate ester resin composition excellent in dielectric properties and heat resistance and good in flame retardancy, and a prepreg and a metal foil clad laminate using the cyanate ester resin composition.

Patent Literature 2 discloses that a flame-retardant adhesive composition containing as essential components an imide bond-containing urethane resin, an epoxy resin and a flame retardant is excellent in compatibility of adhesion with electric insulation and compatibility of flexibility with heat resistance.

Patent Literature 3 discloses a low-dielectric constant insulating resin composition containing a low-dielectric constant-imparting agent in which a low-dielectric constant-imparting component is embedded in a porous substance, and containing an insulating resin composition.

CITATION LIST

Patent Literature

Patent Literature 1: Japanese Patent Laid-Open No. 2008-075012
Patent Literature 2: Japanese Patent Laid-Open No. 2011-94037
Patent Literature 3: Japanese Patent Laid-Open No. 2010-285624

SUMMARY OF INVENTION

Technical Problem

The cyanate ester resin composition disclosed in Patent Literature 1, because of containing a cyano group, which has a high polarity, is liable to pose a problem with insulation reliability. Further the cyanate ester resin composition disclosed in Patent Literature 1, because of containing a brominated substance, may possibly impart a load to the environment, therefore being limited in its use applications.

The flame-retardant adhesive composition disclosed in Patent Literature 2, because of containing an imide group, which has a high polarity, has a problem which is that the dielectric constant and the dielectric loss tangent deteriorate. Further the flame-retardant adhesive composition disclosed in Patent Literature 2 can hardly be said to provide sufficient flexibility.

The low-dielectric constant insulating resin composition disclosed in Patent Literature 3, since the proportion of a low-dielectric constant-imparting agent in the whole resin composition is high, can hardly provide a resin composition having sufficient flexibility in using it in the field of electronic materials, particularly in the field of flexible printed circuit boards.

In consideration of the above situation, the technical problem of the present invention is to provide a resin composition, as a material for FPC, having excellent low-dielectric properties, flexibility and insulation reliability, and being excellent in close adhesion, heat resistance and circuit embeddability.

Solution to Problem

As a result of exhaustive studies to solve the above problem, the present inventors have found that when a resin composition comprises a urethane resin obtained by reacting a polycarbonate diol and an isocyanate in specific amounts, an epoxy resin and a filler, the above problem can be solved, and this finding has led to the completion of the present invention.

That is, the present invention is as follows.

[1]
A low-dielectric resin composition, comprising (A) a urethane resin obtained by reacting a polycarbonate diol and an isocyanate, (B) an epoxy resin and (C) a filler, wherein the (A) urethane resin has a carboxyl group equivalent weight of 1,100 to 5,700 g/eq;
the epoxy equivalent weight of the (B) epoxy resin is 0.3 to 4.5 equivalents per 1 equivalent of the carboxyl group of the (A) urethane resin;
the (A) urethane resin has a weight-average molecular weight of 5,000 to 80,000;
the (A) urethane resin has a polycarbonate content of 35% by mass or lower;
the resin composition comprises 50 parts by mass or less of the (C) filler per 100 parts by mass of the (A) urethane resin; and
the resin composition comprises substantially no imide group.

[2]
The low-dielectric resin composition according to [1], wherein the (A) urethane resin has a polycarbonate content of 20 to 35% by mass.

[3]
The low-dielectric resin composition according to [1] or [2], wherein the (C) filler is an organic filler.

[4]
The low-dielectric resin composition according to [3], wherein the organic filler is one selected from the group consisting of an organophosphorus compound, a phosphazene compound and melamine.

[5]
The low-dielectric resin composition according to any one of [1] to [4], further comprising (D) a styrene resin.

[6]
A coverlay, comprising a low-dielectric resin composition according to any one of [1] to [5].

[7]
A bonding sheet, comprising a low-dielectric resin composition according to any one of [1] to [5].
[8]
A resin coated copper foil, comprising a low-dielectric resin composition according to any one of [1] to [5].
[9]
A laminate, comprising a low-dielectric resin composition according to any one of [1] to [5].

Advantageous Effects of Invention

According to the present invention, there can be provided a resin composition, as a material for FPC, having excellent low-dielectric properties, flexibility and insulation reliability, and being excellent in close adhesion, heat resistance and circuit embeddability.

DESCRIPTION OF EMBODIMENTS

Hereinafter, an embodiment (hereinafter, referred to as "the present embodiment") to carry out the present invention will be described in detail. Here, the present invention is not limited to the following embodiment, and can be carried out by being variously changed and modified within its gist.
[Low-Dielectric Resin Composition]
A low-dielectric resin composition in the present embodiment comprises (A) a urethane resin obtained by reacting a polycarbonate diol and an isocyanate, (B) an epoxy resin and (C) a filler, wherein the (A) urethane resin has a carboxyl group equivalent weight of 1,100 to 5,700 g/eq; the epoxy equivalent weight of the (B) epoxy resin is 0.3 to 4.5 equivalents per 1.0 equivalent of the carboxyl group of the (A) urethane resin; the (A) urethane resin has a weight-average molecular weight of 5,000 to 80,000; the (A) urethane resin has a polycarbonate content of 35% by mass or lower; the resin composition comprises 50 parts by mass or less of the (C) filler per 100 parts by mass of the (A) urethane resin; and the resin composition comprises substantially no imide group.

The low-dielectric resin composition according to the present invention is long in the usable period and is excellent in the product life performance and the varnish life performance.

Further as properties of a resin composition in the case where the low-dielectric resin composition is cured, low-dielectric properties of a low dielectric constant and/or a low dielectric loss tangent are developed.

Further, the low-dielectric resin composition according to the present invention, as a material for FPC, has flexibility and insulation reliability, and is excellent also in close adhesion, heat resistance and circuit embeddability.

In the present embodiment, "low-dielectric" in the low-dielectric resin composition means that the resin composition has dielectric properties of a low dielectric constant and/or a low dielectric loss tangent.

Specifically, in the low-dielectric resin composition according to the present embodiment, it is preferable that the dielectric constant be lower than 3.0 and the dielectric loss tangent be lower than 0.010.

In the present embodiment, the low-dielectric resin composition comprises (A) a urethane resin.

The (A) urethane resin in the present embodiment means a resin having a urethane structure obtained by reacting a polycarbonate diol and an isocyanate.

The (A) urethane resin may be produced by mixing the polycarbonate diol with another diol compound and/or a polyol.

In the present embodiment, the (A) urethane resin can also be described as a urethane resin having a partial structure represented by the following structure.

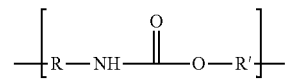

In the above structure, R denotes a residue excluding at least one —NCO group of an isocyanate; and R' denotes a residue excluding at least one —OH group of a polycarbonate diol.

The (A) urethane resin in the present embodiment may further have a partial structure represented by the following structure.

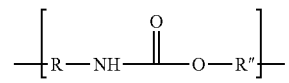

In the above structure, R denotes a residue excluding at least one —NCO group of an isocyanate; and R" denotes a residue excluding at least one —OH group of a diol compound or a polyol.

The (A) urethane resin may be used singly or concurrently in two or more thereof.

In the present embodiment, the polycarbonate diol means a compound intramolecularly having terminal diol structures, and carbonate structures as a repeating structure, and is, for example, a compound obtained by polymerizing a diol compound or the like with a carbonate ester, phosgene or the like.

The polycarbonate diol may be used singly or concurrently in two or more thereof.

In the present embodiment, the diol compound is a compound having two hydroxyl groups in one molecule thereof.

Examples of the diol compound include ethylene glycol, diethylene glycol, 1,2-propanediol, 1,3-propanediol, 2-methyl-1,3-propanediol, 2,2-dimethyl-1,3-propanediol, 2,2-diethyl-1,3-propanediol, 2-butyl-2-ethyl-1,3-propanediol, 2-pentyl-2-propyl-1,3-propanediol, 1,2-butanediol, 1,3-butanediol, 1,4-butanediol, 1,5-pentanediol, 1,5-hexanediol, 1,6-hexanediol, 3-methyl-1,5-pentanediol, 2-ethyl-1,3-hexanediol and 2,2,4-trimethyl-1,3-pentanediol.

As the diol compound, preferable are 1,4-butanediol, 1,5-pentanediol, 1,6-hexanediol, 2,2-diethyl-1,3-propanediol, 2-butyl-2-ethyl-1,3-propanediol and 2-pentyl-2-propyl-1,3-propanediol; and from the viewpoint of flexibility, close adhesion and/or circuit embeddability, more preferable are 1,4-butanediol, 1,5-pentanediol and 1,6-hexanediol, and still more preferable is 1,6-hexanediol.

When the polycarbonate diol is produced, there may also be used, as a polyol compound other than the diol compound, a compound having three or more hydroxyl groups in one molecule thereof.

The diol compound may be used singly or concurrently in two or more thereof.

Examples of the carbonate ester when the polycarbonate diol is produced include dialkyl carbonates such as dimethyl carbonate, diethyl carbonate, dipropyl carbonate and dibutyl carbonate; diaryl carbonates such as diphenyl carbonate; and alkylene carbonates such as ethylene carbonate, trimethylene carbonate, 1,2-propylene carbonate, 1,2-butylene carbonate, 1,3-butylene carbonate and 1,2-pentylene carbonate.

As the carbonate ester, from the viewpoint of dielectric properties in the low-dielectric resin composition, preferable are dialkyl carbonates such as dimethyl carbonate, diethyl carbonate and dibutyl carbonate.

The isocyanate is a compound having a free isocyanate group(s) in one molecule thereof. The isocyanate can be synthesized by a reaction of a primary amine with phosgene.

As the isocyanate, preferably used are diisocyanates being compounds having two free isocyanate groups in one molecule thereof.

Examples of the diisocyanate include aliphatic diisocyanates such as hexamethylene diisocyanate, trimethylhexamethylene diisocyanate, lysine diisocyanate and trimethylene diisocyanate; alicyclic diisocyanates such as isophorone diisocyanate, methylene bis(cyclohexylisocyanate) and cyclohexane diisocyanate; and aromatic diisocyanates such as xylene diisocyanate, tolylene diisocyanate, diphenylmethane diisocyanate, naphthalene diisocyanate and biphenylene diisocyanate.

As the diisocyanate, from the viewpoint of dielectric properties in the low-dielectric resin composition, preferable are aliphatic isocyanates; and more preferable are hexamethylene diisocyanate and trimethylhexamethylene diisocyanate.

As a polyisocyanate other than diisocyanates, there may be used compounds having three or more isocyanate groups in one molecule thereof.

The isocyanate may be used singly or concurrently in two or more thereof.

In the reaction of a polycarbonate diol with an isocyanate, there can be broadly applied reaction conditions of usual urethanization reactions.

The polycarbonate content in the (A) urethane resin means a proportion of a carbonate structure (=O(C=O)O—) in the (A) urethane resin; and in the case where the (A) urethane resin is taken to be 100% by mass, the content is 35% by mass or lower, and from the viewpoint of dielectric properties in the low-dielectric resin composition, preferably 20 to 35% by mass, and more preferably 25 to 30% by mass.

When the polycarbonate content is 35% by mass or lower, the low-dielectric resin composition can be made to be one excellent in close adhesion.

The weight-average molecular weight of the (A) urethane resin is 5,000 to 80,000, and preferably 10,000 to 75,000.

When the weight-average molecular weight is 5,000 or higher, the low-dielectric resin composition can be made to be one excellent in flexibility; and when being 80,000 or lower, the low-dielectric resin composition can be made to be one having good flowability and being excellent in circuit embeddability. When the low-dielectric resin composition is excellent in circuit embeddability, the processability of the low-dielectric resin composition and in the curing thereof is excellent, and generation of voids and lifting can be prevented.

The carboxyl group in the (A) urethane resin is 1,100 to 5,700 g/eq, and preferably 1,400 to 2,800 g/eq.

When the carboxyl group is 1,100 g/eq or higher, the number of carboxyl groups to react with epoxy groups can be reduced. Thereby, in a so-called varnish state before heating, since the reaction of epoxy groups with carboxyl groups is suppressed, the varnish life performance is improved.

Further, since the carboxyl groups all react with the epoxy groups in heating (in the processing time for being processed to products such as coverlays), and after the heating (after the processing), the curing reaction does not advance beyond that, the product life performance is improved.

Further in the pressing and heating time in a lamination step of products, since no unreacted carboxyl groups exist, the dielectric properties become good.

Further, when the carboxyl group is 5,700 g/eq or lower, the low-dielectric resin composition can be made to be one excellent in dielectric properties, and since it becomes easy for a three-dimensional network to be efficiently formed, the low-dielectric resin composition can be made to be one excellent in heat resistance.

In the present embodiment, the low-dielectric resin composition comprises (B) an epoxy resin.

In the present embodiment, examples of the epoxy resin include bisphenol A epoxy resins, bisphenol F epoxy resins, bisphenol S epoxy resins, novolac epoxy resins, biphenyl epoxy resins, cyclopentadiene epoxy resins, glycidylamine epoxy resins and condensed polycyclic epoxy resins.

Among these, preferable are cyclopentadiene epoxy resins, which comprise no benzene rings having a polarity and have a rigid skeleton good in heat resistance.

The (B) epoxy resin may be used singly or concurrently in two or more thereof.

The low-dielectric resin composition according to the present embodiment, by the reaction of carboxyl groups originated from the (A) urethane resin with epoxy groups originated from the (B) epoxy resin, is increased in the crosslinking density and made to be a resin composition excellent in sufficient close adhesion, heat resistance and the like.

The epoxy equivalent weight of the (B) epoxy resin is preferably 0.3 to 4.5 equivalents, and more preferably 0.5 to 4.0 equivalents, per 1 equivalent of carboxyl group of the (A) urethane resin.

When the epoxy equivalent weight is 0.3 equivalents or higher, the low-dielectric resin composition can be made to be one excellent in heat resistance; and when being 4.5 equivalents or lower, the low-dielectric resin composition can be made to be one excellent in dielectric properties and excellent also in insulation reliability.

In the present embodiment, the low-dielectric resin composition comprises (C) a filler.

The filler is not especially limited as long as being one to be used as a filler, but includes organic fillers and inorganic fillers.

The filler may be used singly or concurrently in two or more thereof.

Examples of the organic filler include organophosphorus compounds, phosphazene compounds and melamine; and examples of the inorganic filler include aluminum hydroxide, magnesium hydroxide, magnesium hydroxide and silica.

The organophosphorus compounds are not especially limited, but examples thereof include OP930, manufactured by Clariant International Ltd., and PX-200, manufactured by Daihachi Chemical Industry Co., Ltd.; and the phosphazene compounds are not especially limited, but examples thereof include Rabitle FP-100, manufactured by Fushimi Pharmaceutical Co., Ltd., and SPB-100L, manufactured by Otsuka Chemical Co., Ltd.

In the present embodiment, the low-dielectric resin composition comprises 50 parts by mass or less of the (C) filler, and preferably 30 parts by mass or less thereof, per 100 parts by mass of the (A) urethane resin. Further from the viewpoint of the flame retardancy, it is suitable that the low-dielectric resin composition comprise 5 parts by mass or more of the (C) filler per 100 parts by mass of the (A) urethane resin.

When the composition comprises 50 parts by mass or less of the filler, since it becomes easy for resin components other than the filler to contact with a base material such as a copper foil, the close adhesion is improved. Further since the proportion of the filler in the whole resin composition becomes low, the low-dielectric resin composition can be made to be one excellent in dielectric properties.

In the present embodiment, the resin composition comprises substantially no imide group.

In the present embodiment, "comprising substantially no imide group" means that the low-dielectric resin composition comprises an imide group only in a degree of not affecting the dielectric properties thereof.

Specifically, the "comprising substantially no imide group" means that it is not excluded that the low-dielectric resin composition in the present embodiment comprises an extremely minute amount of an imide group as long as the resin composition develops dielectric properties excellent in the low dielectric constant and the low dielectric loss tangent. Preferably, the low-dielectric resin composition comprises no imide group as the component.

In the present embodiment, the low-dielectric resin composition, from the viewpoint of improving processability such as circuit embeddability, may comprise (D) a styrene resin.

In the present embodiment, the styrene resin is not especially limited as long as being a polymer containing styrene as a monomer, but may be a copolymer with other monomers.

In the case where the styrene resin is a copolymer, the copolymer includes block copolymers in which part of unsaturated bonds is hydrogenated containing styrene polymer blocks and butadiene polymer blocks, copolymers containing styrene copolymer blocks, butadiene polymer blocks and butylene copolymer blocks, and copolymers containing styrene copolymer blocks, ethylene polymer blocks and butylene copolymer blocks.

The styrene resin may contain functional groups such as a carboxyl group and an oxazoline group. Examples of the styrene resin containing functional groups include carboxyl group-containing styrene resins and oxazoline group-containing styrene resins. When the styrene resin contains such functional groups, epoxy groups of the epoxy resin react with the functional groups in the heating or pressing and heating time to thereby form a three-dimensional network in the resin composition. Consequently, the heat resistance of the resin composition after curing is improved.

The styrene resin may be used singly or concurrently in two or more thereof.

In the present embodiment, the low-dielectric resin composition comprises the (D) styrene resin preferably in 20 parts by mass or more, and more preferably in 100 parts by mass or more, per 100 parts by mass of the (A) urethane resin. When the low-dielectric resin composition comprises 20 parts by mass or more of the styrene resin, the viscosity of the resin composition in the heating or pressing and heating time is suitably reduced. Consequently, for example, the resin composition evenly spreads to every nook and corner of circuits in a lamination step of products, and the circuit embeddability is improved.

The low-dielectric resin composition may comprise, as a solvent, for example, acetone, toluene, methyl ethyl ketone, methyl isobutyl ketone, cyclohexanone, propylene glycol monomethyl ether and/or dimethylacetamide.

The solvent may be used singly or concurrently in two or more thereof.

The low-dielectric resin composition may comprise additives, in addition to the (A) urethane resin, the (B) epoxy resin, the (C) filler and the (D) styrene resin; and as the additives, there can be used various types of well-known additives, for example, hindered phenol-containing, phosphorus-containing, sulfur-containing or other antioxidants; stabilizers such as light stabilizers, weather stabilizers and heat stabilizers; flame retardants such as tris(dibromopropyl) phosphate, triallyl phosphate and antimony oxide; anionic, cationic or nonionic surfactants; antistatic agents; plasticizers; and lubricants.

The additives may be used singly or concurrently in two or more thereof.

The amounts of the additives to be blended can suitably be regulated according to purposes in the range of not impairing the advantage of the present invention.

In the present embodiment, the low-dielectric resin composition can be used as a semicured adhesive layer, and particularly as an adhesive layer in coverlays, bonding sheets, resin coated copper foils and laminates.

The thickness of the low-dielectric resin composition layer in such applications is not especially limited, but is preferably 10 to 50 μm, and more preferably 15 to 30 μm.

The coverlay is in a form in which the low-dielectric resin composition is applied on a base film and is semicured to a B-stage, and may be in a form of being further laminated with a separator.

Examples of resins for forming the base film include polyimide, liquid crystal polymers, polyphenylene sulfide, syndiotactic polystyrene, polyethylene terephthalate, polyethylene naphthalate, polycarbonate, polybutylene terephthalate, polyether ether ketone and fluororesins.

Examples of the fluororesins include PTFE (polytetrafluoroethylene), PFA (polytetrafluoroethylene-perfluoroalkyl vinyl ether copolymers), FEP (tetrafluoroethylene-hexafluoropropylene copolymers), ETFE (tetrafluoroethylene-ethylene copolymers), PCTFE (polychlorotrifluoroethylene) and PVDF (polyvinylidene fluoride).

The separator is not especially limited as long as being used for foreign matter removal, and being good in sufficient laminatability and handleability in peeling, but there can be used separators of paper, polyethylene terephthalate, polypropylene or the like.

The bonding sheet is in a form in which the low-dielectric resin composition is applied on a release-treated film, and semicured to a B-stage, and may be in a form of being further laminated with a separator. Further, the bonding sheet may be in a form of the low-dielectric resin composition alone peeled off from the release-treated film.

Examples of resins for forming the release-treated film include polyethylene terephthalate, polyethylene naphthalate, polypropylene, polyethylene and polybutylene terephthalate; and among these, from the viewpoint of reducing the production cost, preferable are polypropylene, polyethylene and polyethylene terephthalate. As the release-treated film, other than resin films, release papers may be used.

The resin coated copper foil may be in a form in which the low-dielectric resin composition is applied on a copper foil, and semicured to a B-stage, or in a form in which a copper foil is thermally laminated on a bonding sheet-like low-dielectric resin composition (in a semicured state).

The laminate may be a copper clad laminate in which the low-dielectric resin composition is applied on a base film, and laminated with copper foils.

A production method of the coverlay is not especially limited, and a coverlay can be obtained, for example, by a step of applying a varnish of the low-dielectric resin composition on a base film, and drying the varnish to a B-stage.

In the case where the coverlay contains the separator, the coverlay can be produced, for example, by laminating the separator on the surface provided with the low-dielectric resin composition layer.

A production method of the bonding sheet is not especially limited, and the bonding sheet can be obtained, for example, by a step of applying a varnish of the low-dielectric resin composition on the release-treated film, and drying the varnish to a B-stage.

In the case where the bonding sheet contains the separator, the bonding sheet can be produced, for example, by making the separator to face the surface provided with the low-dielectric resin composition layer and laminating the separator on the surface.

A production method of the resin coated copper foil is not especially limited, and the resin coated copper foil can be obtained, for example, by a step of applying a varnish of the low-dielectric resin composition on a copper foil, and drying the varnish to a B-stage.

A copper clad laminate may be made by applying a varnish of the low-dielectric resin composition on a base film, and then laminating copper foils thereon. Here, the resin composition at this time is one cured to a C-stage, which is more advanced in the degree of curing than the B-stage.

When the low-dielectric resin composition is applied as a varnish, according to the application thickness, there can suitably be used a comma coater, a die coater, a gravure coater or the like.

The drying of the varnish can be carried out by an inline drier or the like; and the drying conditions can suitably be regulated according to the low-dielectric resin composition.

Examples of a method of laminating the films include a method using a press, and a lamination method using a heat roll.

The lamination conditions can be set, for example, in the ranges of a temperature of 40 to 120° C. and a pressure of 0.1 to 3.0 MPa.

In the present embodiment, a flexible printed circuit board may be made by laminating the coverlay on a circuit-formed surface of a copper clad laminate.

Measurement and evaluation of each physical property in the present description can be carried out according to the following method described in Examples unless otherwise clearly specified.

EXAMPLES

Hereinafter, the present invention will be described more specifically by way of Examples and Comparative Examples, but the present invention is not limited only to these Examples.

Measurement and evaluation of each physical property in Examples and Comparative Examples were carried out by the following method.
<Weight-Average Molecular Weight>

The weight-average molecular weight was measured according to JIS K7252-1.

Specifically, it was measured as follows. A GPC (gel permeation chromatography) measurement apparatus (HLC-8120, manufactured by Tosoh Corp.) was used. A sample dissolved in tetrahydrofuran as an eluate was subjected to GPC using one column of M-M of columns (TSK gel super H, manufactured by Tosoh Corp.) and two columns of 2000 thereof connected in series and under the conditions of a flow rate of 0.3 mL/min and a temperature of 40° C.; and the retention time was measured and the weight-average molecular weight of the sample was calculated in terms of standard polystyrenes.
<Carboxyl Group Equivalent Weight>

The carboxyl group equivalent weight was measured according to JIS K1557-5.

Specifically, it was measured as follows. 200 mL of 2-propanol, 100 mL of water and 7 drops of a methanol solution of Bromothymol Blue were added, and the resultant solution was titrated with a methanol solution of a 0.02 mol/L potassium hydroxide until the solution turned green; and 50 g of a sample was dissolved therein. Then, the resultant solution was titrated with a methanol solution of a 0.02 mol/L potassium hydroxide, and the carboxyl group equivalent weight was calculated by the following calculation expression.

Carboxyl group equivalent weight (g/eq)=(56,100×3 (g/amount of sample taken)/((1.122×(titrant volume consumed mL)×0.02 (titrant concentration))

<Polycarbonate Content>

The polycarbonate content was calculated as a proportion of the theoretical molecular weight of the carbonate group to the whole molecular weight of an obtained urethane resin.
<Peel Strength>

The separator was peeled off from the coverlay containing the separator. The adhesive layer surface of the coverlay and the shiny surface of a rolled copper foil (BHY-22B-T (35 μm), manufactured by JX Nippon Mining & Metals Corp.) were laminated, and heated and pressed under the conditions of 160° C., 3.0 MPa (pressure per $cm^2$) and 60 min, and cut into a size of 10 mm in width×100 mm in length.

The peel strength in the 90° direction of the obtained evaluation sample was measured by using an Autograph (AGS-500, manufactured by Shimadzu Corp.).

The peel strength was evaluated as follows from an average of 5-times measurements according to JPCA-BM02.

◎: The peel strength was 10 N/cm or higher.

○: The peel strength was 5 N/cm or higher and lower than 10 N/cm.

x: The peel strength was lower than 5 N/cm.
<Solder Reflow Resistance>

The separator was peeled off from the coverlay containing the separator. The adhesive layer surface of the coverlay and the shiny surface of a rolled copper foil (BHY-22B-T (35 μm), manufactured by JX Nippon Mining & Metals Corp.) were laminated, and heated and pressed under the conditions of 160° C., 3.0 MPa (pressure per $cm^2$) and 60 min, and cut into a size of 50 mm×50 mm.

The obtained sample further treated under the conditions of 40° C. and 90% RH for 96 hours was used as a treated evaluation sample; and the obtained sample as it was untreated was used as an untreated evaluation sample.

The treated evaluation sample and the untreated evaluation sample were passed through a solder reflow furnace so set that the peak temperature became 260° C.; the exposure time of the peak temperature, 10 sec; and the conveyance speed, 300 mm/min.

The solder reflow resistance was evaluated by visually checking whether blistering or peeling was present in each evaluation sample after being passed through the solder reflow furnace.

○: No blistering nor peeling was observed.
x: Blistering or peeling was observed.

<Insulation Reliability>

As an adherend, there was used the one in which a circuit pattern of L/S=50/50 was formed on the shiny surface of an electrodeposited copper foil (manufactured by JX Nippon Mining & Metals Corp., thickness: 18 μm) of a two-layer substrate in which a polyimide layer of 25 μm in thickness was constituted on the mat surface of the copper foil.

The separator was peeled off from the coverlay containing the separator. The adhesive surface of the coverlay and the circuit pattern-formed surface of the adherend were laminated, and heated and pressed under the conditions of 160° C., 3.0 MPa (pressure per cm$^2$) for 60 min to thereby obtain an evaluation sample.

A DC of 100 V was applied and held for 1,000 hours on the evaluation sample under the conditions of 85° C. and 85% RH; and thereafter, the insulation reliability was evaluated by checking presence/absence of short circuit in the evaluation sample.

○: No short circuit was observed even after the 1,000 hours.
x: Short circuit occurred before the 1,000 hours was reached.

<Flexibility>

An evaluation sample was fabricated as in the insulation reliability test.

The obtained evaluation sample was folded with the base film side valley-folded, and further sandwiched between two aluminum plates of 1 mm in thickness.

The evaluation sample sandwiched between the two aluminum plates was laminated under the conditions of 23° C., 0.5 MPa (pressure per cm$^2$) and 0.5 m/min; and thereafter, presence/absence of cracks was visually checked, and the flexibility was evaluated as follows from an average of 5-times measurements.

The lamination was repeated 10 times at the maximum until cracks were recognized.

⊚: No cracks were recognized at 10 times of the number of times of the lamination.
○: Cracks were recognized at 5 times or more and less than 10 times of the number of times of the lamination.
x: Cracks were recognized at less than 5 times of the number of times of the lamination.

<Dielectric Constant and Dielectric Loss Tangent>

The separator was peeled off from the coverlay containing the separator, and the coverlay was used as an evaluation sample.

The dielectric constant and the dielectric loss tangent were measured in a 23° C. atmosphere under the condition of a frequency of 5 GHz by using an 85071E-300SPDR (resonator method), manufactured by Agilent Technologies, Inc., and the dielectric constant and the dielectric loss tangent were evaluated as follows from averages of 5-times measurements thereof.

The Dielectric Constant
⊚: lower than 3.0
○: 3.0 or higher and lower than 3.2
x: 3.2 or higher The Dielectric Loss Tangent
⊚: lower than 0.010
○: 0.010 or higher and lower than 0.015
x: 0.015 or higher <Circuit Embeddability>

As adherends, there were used the ones in which circuit patterns of L/S=n/n, 6n/n and 10n/n (n=50 to 100) were formed on the shiny surfaces of electrodeposited copper foils (manufactured by JX Nippon Mining & Metals Corp., thickness: 35 μm) of a two-layer substrate in which a polyimide layer of 25 μm in thickness was constituted on the mat surfaces of the copper foils.

The separator was peeled off from the coverlay containing the separator. The adhesive surface of the coverlay and the circuit pattern-formed surfaces of the adherends were laminated, and heated and pressed under the conditions of 160° C., 3.0 MPa (pressure per cm$^2$) for 60 min to thereby obtain evaluation samples.

The surface and a cross-section of each evaluation sample were observed visually and by an optical microscope; and the circuit embeddability was evaluated by checking presence/absence of voids and lifting.

⊚: No voids nor lifting was observed in all the circuit patterns.
○: Voids and lifting were observed in L/S=10n/n, but no voids nor lifting was observed in L/S=6n/n.
x: Voids and lifting were observed in all the circuit patterns.

<Varnish Life Performance>

The resin composition obtained in each Example was fully stirred, and thereafter stored for 3 days under the conditions of 25° C. and 50% RH. The state of the resin composition after the storage was visually observed, and no gelation was recognized.

<Product Life Performance>

As an adherend, there was used the one in which a circuit pattern of L/S=100/100 was formed on the shiny surface of an electrodeposited copper foil (manufactured by JX Nippon Mining & Metals Corp., thickness: 35 μm) of a two-layer substrate in which a polyimide layer of 25 μm in thickness was constituted on the mat surface of the copper foil.

The separator was peeled off from the coverlay containing the separator obtained in each Example. The adhesive surface of the coverlay and the circuit pattern-formed surface of the adherend were laminated, and heated and pressed under the conditions of 160° C., 3.0 MPa (pressure per cm$^2$) for 60 min to thereby obtain an evaluation sample. Surfaces and cross-sections of the evaluation samples were observed visually or by an optical microscope, and no voids nor lifting was observed. By using the coverlays containing the separator after being stored at 5° C. for 3 months, the same test was carried out, and no voids nor lifting was observed.

Production Example 1 Fabrication of a Urethane Resin A (Fabrication of a Polycarbonate Diol)

100 parts by mass of dimethyl carbonate and 132 parts by mass of 1,6-hexanediol were charged in a glass flask. 0.015 parts by mass of titanium tetrabutoxide as a catalyst was added, and stirred and heated at normal pressure. The resultant was stirred and heated at a reaction temperature of 140° C. to 150° C. and a pressure of 3.0 kPa while a mixture of methylene glycol and methylene carbonate produced at the conditions was distilled out. Thereafter, the pressure was reduced down to 0.5 kPa, and the resultant was stirred and heated at 150 to 160° C. further for 10 hours while dimethyl carbonate and 1,6-hexanediol were distilled out to thereby fabricate a polycarbonate diol.

(Fabrication of a Urethane Resin)

100 parts by mass of hexamethylene diisocyanate, 498 parts by mass of the polycarbonate diol and 10 parts by mass of dimethylol butanoate were added to a four-necked glass flask equipped with a cooling tube, a thermometer, a raw material introducing port and a stirring apparatus, and stirring at 90° C. was started. Part of the composition was taken out from the glass flask every 30 min from the start, and deionized water was added to the taken-out composition to thereby terminate the reaction. Thereafter, the reaction solution was extracted with methyl ethyl ketone, and the weight-average molecular weight in the reaction solution was measured by GPC (gel permeation chromatography). Since the weight-average molecular weight in the reaction solution after 6 hours from the start reached 20,000, the flask was cooled to thereby terminate the reaction. After the termination, the reaction solution was diluted with toluene to thereby fabricate a urethane resin A.

Production Examples 2 to 12 Fabrication of Urethane Resins B to L

Urethane resins B to L were fabricated by the same method as in Production Example 1, except for alterations of the reaction time in the fabrication of a polycarbonate diol, the urethane resin reaction time, and the amount of dimethylol butanoate to be charged.

Here, in the fabrication of the urethane resin B, the stirring and heating times were altered to 10 hours and thereafter 5 hours; and in the fabrication of the urethane resin H, the stirring and heating times were altered to 50 hours and thereafter 20 hours.

Production Example 13 Fabrication of a Urethane Resin M

A urethane resin M was fabricated by the same method as in Production Example 1, except for using 246 parts by mass of 1,6-hexanediol in place of the polycarbonate diol, and altering the amount of hexamethylene diisocyanate to be charged to 352 parts by mass.

The polycarbonate contents, the weight-average molecular weights and the carboxyl group equivalent weights of the obtained urethane resins A to M are shown in Table 1.

Co., Ltd.) of 12.5 μm so that the thickness after drying became 25 μm, and cured and dried until turning into a semicured state (B-stage) under the conditions of 160° C. for 5 min to thereby obtain a coverlay.

The adhesive layer surface of the coverlay and the release-treated surface of a PET film (manufactured by Lintec Corp.) having been subjected to a release treatment on one surface thereof were laminated to thereby obtain a coverlay containing the separator.

Examples 2 to 7 and Comparative Examples 1 to 6

Resin compositions and then coverlays containing the separator were obtained by the same method as in Example 1, except for using urethane resins indicated in Table 2 and Table 3 in place of the urethane resin A, and regulating the content of the epoxy resin.

Here, in Table 2 and Table 3, the lower row in the column of the (B) epoxy resin indicates a content (parts by mass) thereof per 100 parts by mass of the (A) urethane resin; and the upper row indicates an epoxy equivalent weight of the (B) epoxy resin per 1 equivalent of the carboxyl group.

Examples 8 and 9 and Comparative Examples 7 and 8

Resin compositions and then coverlays containing the separator were obtained by the same method as in Example 1, except for altering the ratio of an equivalent weight of the epoxy resin to 1 equivalent of the carboxyl group of the urethane resin A.

Example 10 and Comparative Example 9

Resin compositions and then coverlays containing the separator were obtained by the same method as in Example 1, except for altering the content of the filler.

TABLE 1

| | | A | B | C | D | E | F | G | H | I | J | K | L | M |
|---|---|---|---|---|---|---|---|---|---|---|---|---|---|---|
| Total Reaction Time in Fabrication of Polycarbonate Diol Polyurethane | [hours] | 30 | 15 | 30 | 30 | 30 | 30 | 30 | 70 | 30 | 30 | 30 | 30 | 30 |
| Polycarbonate Diol | [parts by mass] | 498 | 498 | 498 | 498 | 498 | 498 | 498 | 498 | 498 | 498 | 498 | 498 | |
| 1,6-Hexanediol | [parts by mass] | | | | | | | | | | | | | 246 |
| Hexamethylene Diisocyanate | [parts by mass] | 100 | 100 | 100 | 100 | 100 | 100 | 100 | 100 | 100 | 100 | 100 | 100 | 352 |
| Dimethylol Butanoate | [parts by mass] | 10 | 10 | 10 | 10 | 10 | 5 | 18 | 10 | 1 | 30 | 10 | 10 | 10 |
| Total Reaction Time | [hours] | 6 | 10 | 4 | 3 | 25 | 6 | 6 | 2 | 6 | 6 | 2 | 36 | 20 |
| Polycarbonate Content | | 30 | 21 | 34 | 30 | 30 | 30 | 30 | 39 | 30 | 30 | 30 | 30 | 0 |
| Weight-Average Molecular Weight | | 20000 | 20000 | 20000 | 10000 | 70000 | 20000 | 20000 | 20000 | 20000 | 20000 | 3000 | 100000 | 20000 |
| Carboxyl Group Equivalent Weight | | 1900 | 1900 | 1900 | 1900 | 1900 | 4000 | 1600 | 1900 | 11000 | 900 | 1900 | 1900 | 1900 |
| Imido Group | | none | none | none | none | none | none | none | none | none | none | none | none | none |

Example 1

100 parts by mass of the urethane resin A was added to a reaction vessel, and 13.9 parts by mass of an epoxy resin (HP7200, epoxy equivalent weight: 265 g/eq, manufactured by DIC Corp.), 15 parts by mass of a filler (OP930, manufactured by Clariant International Ltd.) and 30 parts by mass of methyl ethyl ketone were added and stirred to thereby obtain a resin composition.

The obtained resin composition was applied on a polyimide film (Kapton 50EN, manufactured by Du Pont-Toray Examples 11 and 12

Resin compositions and then coverlays containing the separator were obtained by the same method as in Example 1, except for using the urethane resin A and a styrene resin (Tuftec M1913, carboxyl group equivalent weight: 5,610 g/eq, manufactured by Asahi Kasei Chemicals Corp.) in ratios indicated in Table 2, and regulating the content of the epoxy resin.

Comparative Example 10

A resin composition and then a coverlay containing the separator were obtained by the same method as in Example 1, except for further adding 30 parts by mass of an imide resin (V-8000, carboxyl group equivalent weight: 1,450 g/eq, manufactured by DIC Corp.), and regulating the content of the epoxy resin.

The evaluation results for the resin compositions obtained in the Examples and the Comparative Examples are shown in Table 2 and Table 3.

From the results of Table 2 and Table 3, when the resin compositions comprise no imide group, the resin compositions can be made to be ones having excellent low-dielectric properties, flexibility and insulation reliability, and being excellent in close adhesion, heat resistance and circuit embeddability.

TABLE 2

| | | | Example | | | | | | | | | | | |
|---|---|---|---|---|---|---|---|---|---|---|---|---|---|---|
| | | | 1 | 2 | 3 | 4 | 5 | 6 | 7 | 8 | 9 | 10 | 11 | 12 |
| (A) Urethane Resin [parts by mass] | Urethane Resin A | | 100 | | | | | | | 100 | 100 | 100 | 10 | 80 |
| | Urethane Resin B | | | 100 | | | | | | | | | | |
| | Urethane Resin C | | | | 100 | | | | | | | | | |
| | Urethane Resin D | | | | | 100 | | | | | | | | |
| | Urethane Resin E | | | | | | 100 | | | | | | | |
| | Urethane Resin F | | | | | | | 100 | | | | | | |
| | Urethane Resin G | | | | | | | | 100 | | | | | |
| | Urethane Resin H | | | | | | | | | | | | | |
| | Urethane Resin I | | | | | | | | | | | | | |
| | Urethane Resin J | | | | | | | | | | | | | |
| | Urethane Resin K | | | | | | | | | | | | | |
| | Urethane Resin L | | | | | | | | | | | | | |
| | Urethane Resin M | | | | | | | | | | | | | |
| (B) Epoxy Resin | HP7200 (manufactured by DIC Corp.) | [equivalents] | 1.0 | 1.0 | 1.0 | 1.0 | 1.0 | 1.0 | 1.0 | 0.5 | 2.0 | 1.0 | 4.0 | 1.1 |
| | | [parts by mass] | 13.9 | 13.9 | 13.9 | 13.9 | 13.9 | 6.6 | 16.6 | 7.0 | 27.9 | 13.9 | 5.6 | 12.1 |
| (C) Filler [parts by mass] | OP930 (manufactured by Clariant International Ltd.) | | 15 | 15 | 15 | 15 | 15 | 15 | 15 | 15 | 15 | 40 | 3 | 15 |
| (D) Styrene Resin [parts by mass] | Tuftec M1913 (manufactured by Asahi Kasei Chemicals Corp.) | | | | | | | | | | | | 90 | 20 |
| Imido Resin [parts by mass] | V-8000 (manufactured by DIC Corp.) | | | | | | | | | | | | | |
| | Peel Strength (N/cm) | | ◎ | ◎ | ◎ | ◎ | ◎ | ◎ | ◎ | ◎ | ◎ | ◎ | ○ | ○ |
| Solder Reflow Resistance | Normal Condition | | ○ | ○ | ○ | ○ | ○ | ○ | ○ | ○ | ○ | ○ | ○ | ○ |
| | After Wet Heat Treatment (40° C. × 90% RH × 96 Hr) | | ○ | ○ | ○ | ○ | ○ | ○ | ○ | ○ | ○ | ○ | ○ | ○ |
| | Insulation Reliability | | ○ | ○ | ○ | ○ | ○ | ○ | ○ | ○ | ○ | ○ | ○ | ○ |
| | Flexibility | | ◎ | ◎ | ◎ | ○ | ◎ | ◎ | ◎ | ◎ | ◎ | ◎ | ◎ | ○ |
| | Dielectric Constant of Coverlay (5 GHz) | | ◎ | ◎ | ◎ | ◎ | ◎ | ◎ | ◎ | ◎ | ◎ | ◎ | ◎ | ◎ |
| | Dielectric Loss Tangent of Coverlay (5 GHz) | | ◎ | ◎ | ◎ | ◎ | ◎ | ◎ | ○ | ◎ | ○ | ◎ | ◎ | ◎ |
| | Circuit Embeddability | | ○ | ○ | ○ | ○ | ○ | ○ | ○ | ○ | ○ | ○ | ◎ | ○ |

TABLE 3

| | | | Comparative Example | | | | | | | | | |
|---|---|---|---|---|---|---|---|---|---|---|---|---|
| | | | 1 | 2 | 3 | 4 | 5 | 6 | 7 | 8 | 9 | 10 |
| (A) Urethane Resin [parts by mass] | Urethane Resin A | | | | | | | | 100 | 100 | 100 | 100 |
| | Urethane Resin B | | | | | | | | | | | |
| | Urethane Resin C | | | | | | | | | | | |
| | Urethane Resin D | | | | | | | | | | | |
| | Urethane Resin E | | | | | | | | | | | |
| | Urethane Resin F | | | | | | | | | | | |
| | Urethane Resin G | | | | | | | | | | | |
| | Urethane Resin H | | | 100 | | | | | | | | |
| | Urethane Resin I | | | | 100 | | | | | | | |
| | Urethane Resin J | | | | | 100 | | | | | | |
| | Urethane Resin K | | | | | | 100 | | | | | |
| | Urethane Resin L | | | | | | | 100 | | | | |
| | Urethane Resin M | | 100 | | | | | | | | | |
| (B) Epoxy Resin | HP7200 (manufactured by DIC Corp.) | [equivalents] | 1.0 | 1.0 | 1.0 | 1.0 | 1.0 | 1.0 | 0.2 | 5.0 | 1.0 | 1.4 |
| | | [parts by mass] | 13.9 | 13.9 | 2.4 | 29.4 | 13.9 | 13.9 | 2.8 | 69.7 | 13.9 | 19.4 |
| (C) Filler [parts by mass] | OP930 (manufactured by Clariant International Ltd.) | | 15 | 15 | 15 | 15 | 15 | 15 | 15 | 15 | 70 | 15 |
| (D) Styrene Resin [parts by mass] | Tuftec M1913 (manufactured by Asahi Kasei Chemicals Corp.) | | | | | | | | | | | |

TABLE 3-continued

| | | Comparative Example | | | | | | | | | |
|---|---|---|---|---|---|---|---|---|---|---|---|
| | | 1 | 2 | 3 | 4 | 5 | 6 | 7 | 8 | 9 | 10 |
| Imido Resin [parts by mass] | V-8000 (manufactured by DIC Corp.) | | | | | | | | | | 30 |
| | Peel Strength (N/cm) | ⊚ | X | ○ | X | X | ○ | ○ | X | X | ○ |
| Solder Reflow Resistance | Normal Condition | ○ | ○ | X | ○ | X | ○ | X | ○ | ○ | X |
| | After Wet Heat Treatment (40° C. × 90% RH × 96 Hr) | ○ | ○ | X | ○ | X | ○ | X | ○ | ○ | X |
| | Insulation Reliability | ○ | ○ | ○ | ○ | ○ | ○ | ○ | X | ○ | ○ |
| | Flexibility | ○ | ○ | ○ | X | X | ○ | ○ | ○ | X | ○ |
| | Dielectric Constant of Coverlay (5 GHz) | X | ○ | ○ | X | X | ○ | ○ | X | X | X |
| | Dielectric Loss Tangent of Coverlay (5 GHz) | X | ○ | ○ | X | X | ○ | ○ | X | X | X |
| | Circuit Embeddability | ○ | ○ | ○ | ○ | X | X | ○ | ○ | X | X |

INDUSTRIAL APPLICABILITY

The low-dielectric resin composition according to the present invention, because of having excellent low-dielectric properties, flexibility and insulation reliability, and being excellent in close adhesion, heat resistance and circuit embeddability, has the industrial applicability as a material for FPC.

The invention claimed is:

1. A resin composition, comprising (A) a urethane resin obtained by reacting a polycarbonate diol and an isocyanate, (B) an epoxy resin, and (C) a filler,
    wherein the (A) urethane resin has a carboxyl group equivalent weight of 1,100 to 5,700 g/eq;
    an epoxy equivalent weight of the (B) epoxy resin is 0.3 to 4.5 equivalents per 1.0 equivalent of the carboxyl group of the (A) urethane resin;
    the (A) urethane resin has a weight-average molecular weight of 5,000 to 80,000;
    the (A) urethane resin has a polycarbonate content of 20 to 35% by mass,
    wherein the polycarbonate content is calculated as the percent by mass of the carbonate structure (=O(C=O)O—) to the total mass of the urethane resin;
    the resin composition comprises 50 parts by mass or less of the (C) filler per 100 parts by mass of the (A) urethane resin; and
    the resin composition comprises substantially no imide group.

2. The resin composition according to claim 1, wherein the (C) filler is an organic filler.

3. The resin composition according to claim 2, wherein the organic filler is one selected from the group consisting of an organophosphorus compound, a phosphazene compound and melamine.

4. The resin composition according to claim 1, further comprising (D) a styrene resin.

5. A coverlay, comprising the resin composition according to claim 1.

6. A bonding sheet, comprising the resin composition according to claim 1.

7. A resin coated copper foil, comprising the resin composition according to claim 1.

8. A laminate, comprising the resin composition according to claim 1.

9. A coverlay, comprising the resin composition according to claim 2.

10. A bonding sheet, comprising the resin composition according to claim 2.

11. A resin coated copper foil, comprising the resin composition according to claim 2.

12. A laminate, comprising the resin composition according to claim 2.

13. A coverlay, comprising the resin composition according to claim 4.

14. A bonding sheet, comprising the resin composition according to claim 4.

15. A resin coated copper foil, comprising the resin composition according to claim 4.

16. A laminate, comprising the resin composition according to claim 4.

17. The resin composition according to claim 1, wherein the (B) epoxy resin includes a cyclopentadiene epoxy resin.

* * * * *